(12) United States Patent  
Katayama et al.

(10) Patent No.: US 8,227,279 B2
(45) Date of Patent: Jul. 24, 2012

(54) MANUFACTURING METHOD OF A SEMICONDUCTOR ELEMENT

(75) Inventors: Koji Katayama, Itami (JP); Hiroyuki Kitabayashi, Osaka (JP); Satoshi Arakawa, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 375 days.

(21) Appl. No.: 12/539,355

(22) Filed: Aug. 11, 2009

(65) Prior Publication Data

US 2010/0216268 A1 Aug. 26, 2010

(30) Foreign Application Priority Data

Feb. 24, 2009 (JP) ................................. 2009-041169

(51) Int. Cl.
*H01L 21/00* (2006.01)
(52) U.S. Cl. ..................... 438/39; 438/46; 257/E21.002; 257/79
(58) Field of Classification Search ..................... 257/79, 257/E21.002; 438/39, 46
See application file for complete search history.

(56) References Cited

U.S. PATENT DOCUMENTS

| 6,503,769 B2 * | 1/2003 | Nakamura et al. ............... 438/22 |
| 2002/0164884 A1 | 11/2002 | Lishan |
| 2004/0248334 A1 | 12/2004 | Hoss et al. |
| 2006/0045155 A1 * | 3/2006 | Kim et al. .................. 372/43.01 |
| 2008/0112454 A1 * | 5/2008 | Ma ........................... 372/45.011 |
| 2008/0121916 A1 | 5/2008 | Teng et al. |
| 2008/0293240 A1 * | 11/2008 | Kawada ........................ 438/652 |
| 2008/0308906 A1 * | 12/2008 | Osada et al. .................. 257/615 |

FOREIGN PATENT DOCUMENTS

| DE | 10312214 A1 | 10/2004 |
| EP | 0450255 A1 | 10/1991 |
| EP | 2 120 257 A1 | 11/2009 |
| JP | 2000-004063 | 1/2000 |
| JP | 2001-160650 | 6/2001 |
| JP | 2003-179301 | 6/2003 |
| JP | 2004-119772 | 4/2004 |
| JP | 2009/76867 A | 4/2009 |

OTHER PUBLICATIONS

Machine translation of JP 2004 119772.*

* cited by examiner

*Primary Examiner* — Matthew Landau
*Assistant Examiner* — Sonya McCall Shepard
(74) *Attorney, Agent, or Firm* — Venable LLP; Michael A. Sartori; Leigh D. Thelen

(57) ABSTRACT

A method of manufacturing a semiconductor element of good characteristics at a reduced manufacturing cost is provided. The manufacturing method of the semiconductor element includes a GaN-containing semiconductor layer forming step, an electrode layer forming step, a step of forming an Al film on the GaN-containing semiconductor layer, a step of forming a mask layer made of a material of which etching rate is smaller than that of a material of the Al film, a step of forming a ridge portion using the mask layer as a mask, a step of retreating a position of a side wall of the Al film with respect to a position of a side wall of the mask layer, a step of forming, on the side surface of the ridge portion and the top surface of the mask layer, a protective film made of a material of which etching rate is smaller than that of the material forming the Al film, and a step of removing the Al film and thereby removing the mask layer and a portion of the protective film formed on the top surface of the mask layer.

18 Claims, 7 Drawing Sheets

MANUFACTURING METHOD OF A SEMICONDUCTOR ELEMENT

BACKGROUND OF THE INVENTION

1. Field of the Invention

The present invention relates to a manufacturing method of a semiconductor element, and particularly to a method of manufacturing a semiconductor element having a gallium nitride-containing semiconductor layer.

2. Description of the Background Art

A semiconductor element having a ridge structure in a gallium nitride-containing semiconductor layer has been known. Various methods have been proposed for forming the ridge structure of the semiconductor element.

For example, Japanese Patent Laying-Open No. 2000-004063 (which will be referred to as "patent document 1" hereinafter) has disclosed a technique in which a ridge structure is formed in a gallium nitride-containing semiconductor layer by dry etching, using a first protective film formed of a silicon oxide or a photoresist film as a mask. After the dry etching, a second protective film made of a material different from that of the first protective film is formed over the formed ridge portion (stripe-shaped waveguide), and the first protective film used as the mask for forming the ridge portion is removed with hydrofluoric acid to expose a top surface of the ridge portion that is a region to be in contact with an electrode. The second protective film covers a side surface of the ridge portion, and it has been proposed to use, as a material thereof, an oxide of Ti, V, Zr, Nb, Hf, Ta or the like, or BN, SiC, MN or the like.

Further, Japanese Patent Laying-Open No. 2001-160650 (which will be referred to as a "patent document 2" hereinafter) has disclosed a structure in which the above second protective film has a structure of a multi-layer film. In the multilayer film, a layer for contact with the ridge portion is formed of a nitride film, and a layer remotest from the ridge portion is formed of an oxide layer. Also, the patent document 2 has disclosed a structure in which an electrode is formed on only a top surface of the ridge portion.

Japanese Patent Laying-Open No. 2004-119772 (which will be referred to as "patent document 3" hereinafter) has disclosed the following method as a method of forming the above ridge portion and the protective film covering the side surface ridge portion. First, a film formed of two layers that are an $SiO_2$ film and a $ZrO_2$ film, respectively, is formed as the above first protective film over a gallium nitride-containing semiconductor layer, and heat treatment is performed on the first protective film in an atmosphere of oxygen so that the $ZrO_2$ film may not be etched with ammonium fluoride. Thereafter, the first protective film formed of the $SiO_2$ film and $ZrO_2$ film is partially removed by Reactive Ion Etching (RIE) to form a pattern of the ridge portion in the first protective film. Then, dry etching using an etching gas that contains a chlorine gas is performed to remove partially the gallium nitride-containing semiconductor layer masked with the first protective film so that the ridge portion is formed. Thereafter, the specimen is immersed in a liquid ammonium fluoride so that the side wall of the $SiO_2$ film located under the first protective film is retreated by etching. In this processing, the $ZrO_2$ film subjected to the above heat treatment is not etched by the ammonium fluoride so that only the $SiO_2$ film is selectively etched. Thereafter, a $ZrO_2$ film is formed as the second protective film by an electron beam vapor deposition method or a sputter vapor deposition method to cover entirely the first protective film and the ridge portion. In this processing, the $SiO_2$ film forming the first protective film has the retreated side wall so that the second protective film, i.e., $ZrO_2$ film is not deposited on the side wall of the $SiO_2$ film. The $SiO_2$ film forming the first protective film is removed with the ammonium fluoride so that the $ZrO_2$ film located on this $SiO_2$ film is removed at the same time. In this manner, the second protective film, i.e., $ZrO_2$ film covers the side wall of the ridge portion, and the top surface of the ridge portion is exposed so that an electrode can be formed on this top surface.

Japanese Patent Laying-Open No. 2003-179301 (which will be referred to as "patent document 4" hereinafter) has disclosed the following method as a method of forming a ridge portion and a protective film covering the side surface of the ridge portion. First, a first electrode layer is formed on a gallium nitride-containing semiconductor layer, and a second electrode is formed on a predetermined region of the first electrode layer by a lift-off method. The second electrode has the same planar form as the ridge portion to be formed. Using the second electrode as a mask, etching is performed to remove partially the first electrode layer and the gallium nitride-containing semiconductor layer so that the ridge portion is formed on the gallium nitride-containing semiconductor layer. Thereafter, an insulating film is formed over the whole structure. A step of forming a window in the insulating film on the second electrode is executed for making a contact with the second electrode located above the ridge portion.

The conventional manufacturing methods of the semiconductor elements described above suffer from the following problems. In the manufacturing method disclosed in the patent document 1, the first protective film is removed with the hydrofluoric acid after the second protective film is formed so that the second protective film located on the top surface of the ridge portion is removed (using the lift-off method). In this processing, however, the portion of the second protective film may not be removed completely from the top surface of the ridge portion so that the second protective film may be left as burrs. In this case, when the electrode is formed on the top surface of the ridge portion, contact between the top surface of the ridge portion and the electrode may be incomplete, resulting in a low production yield of the semiconductor element. In this case, it is difficult to reduce the manufacturing cost of the semiconductor element.

In the case where the electrode is formed on only the top surface of the ridge portion as disclosed in the patent document 2, a mask pattern for forming the electrode by the etching must be positioned to match accurately the position of the top surface of the ridge portion. However, adjustment of such positioning becomes more difficult as the size of the ridge portion decreases. When the position of the mask pattern deviates from the position of the ridge portion, the position of the electrode will deviate from the position of the top surface of the ridge portion, which reduces the manufacturing yield of the semiconductor element. Consequently, it is difficult to reduce the manufacturing cost of the semiconductor element.

According to the patent document 3, the heat treatment in the atmosphere of oxygen must be performed on the $ZrO_2$ film forming the first protective film for increasing a resistance to the ammonium fluoride (for preventing the etching with the ammonium fluoride), and the reduction of the manufacturing cost is difficult due to requirement of the heat treatment.

According to the patent document 4, the window located above the ridge portion is formed in the insulating film for the connection between the electrode and an external circuit. In the process of forming the mask pattern of the etching for forming the window, the position of the mask pattern must accurately match the position of the top surface of the ridge portion. However, adjustment for such positions becomes more difficult as the size of the ridge portion decreases. When the position of the mask pattern deviates from the position of the ridge portion, the position of the window for exposing the electrode deviates from the position of the top surface of the ridge portion (i.e., the position of the region where the electrode is formed). Consequently, the manufacturing yield of the semiconductor element lowers so that it is difficult to reduce the manufacturing cost of the semiconductor element.

In the techniques disclosed in the patent documents 1 to 3, the ridge portion is formed and thereafter the electrode layer is formed on the ridge portion. In this case, the surface of the gallium nitride-containing semiconductor layer is oxidized or contaminated by impurities in manufacturing steps preceding the step of forming the electrode layer. This results in a problem of rising of the drive voltage of the produced element.

SUMMARY OF THE INVENTION

An object of the invention is to provide a method of manufacturing a semiconductor element of good characteristics at a reduced manufacturing cost.

A manufacturing method of a semiconductor element according to the invention executes the following steps. First, the method executes a step of preparing a gallium nitride-containing semiconductor layer forming the semiconductor element. It executes a step of forming an electrode layer on the gallium nitride-containing semiconductor layer. It executes a step of forming a first film on the electrode layer. It executes a step of forming a second film having a pattern and made of a material of which rate of etching with alkaline etchant is smaller than that of a material of the first film. It executes a step of forming a ridge portion in the gallium nitride-containing semiconductor layer in a region located under the second film by performing the etching to remove partially the first film, the electrode layer and the gallium nitride-containing semiconductor layer masked with the second film. It executes a step of retreating a position of an end surface of the first film with respect to a position of an end surface of the second film by removing the end of the first film located on the ridge portion by the etching using the alkaline etchant. It executes a step of forming, on the side surface of the ridge portion and the top surface of the second film, a protective film made of a material of which rate of etching with the alkaline etchant is smaller than that of the material forming the first film. It executes a step of removing the first film by the etching using the alkaline etchant, and thereby removing the second film and a portion of the protective film formed on the top surface of the second film.

Also, a manufacturing method of a semiconductor element according to the invention executes the following steps. First, the method executes a step of preparing a gallium nitride-containing semiconductor layer forming the semiconductor element. It executes a step of forming an electrode layer on the gallium nitride-containing semiconductor layer. It executes a step of forming a first film on the electrode layer. It executes a step of forming a second film having a pattern and made of a material of which rate of etching with mixed acid made of phosphoric acid, nitric acid, acetic acid and water is smaller than that of a material of the first film. It executes a step of forming a ridge portion in the gallium nitride-containing semiconductor layer in a region located under the second film by performing the etching to remove partially the first film, the electrode layer and the gallium nitride-containing semiconductor layer masked with the second film. It executes a step of retreating a position of an end surface of the first film with respect to a position of an end surface of the second film by removing the end of the first film located on the ridge portion by the etching using the mixed acid. It executes a step of forming, on the side surface of the ridge portion and the top surface of the second film, a protective film made of a material of which rate of etching with the mixed acid is smaller than that of the material forming the first film. It executes a step of removing the first film by the etching using the mixed acid etchant, and thereby removing the second film and a portion of the protective film formed on the top surface of the second film.

In the above methods, the second film is used as the mask for forming the ridge portion, and the second film (having the top surface on which the portion of the protective film is formed) will be removed simultaneously with the removal of the first film for exposing the top surface of the ridge portion. Therefore, the portion of the protective film can be reliably removed from the top surface of the ridge portion. Accordingly, the possibility that the position of the top surface of the ridge portion deviates from the position of the portion of the protective film to be removed can be small, as compared with the case where a new resist pattern or the like independent of the mask used for forming the ridge portion is formed for removing the portion of the protective film from the top surface of the ridge portion. Accordingly, it is possible to prevent occurrence of such a problem that the position of the top surface of the ridge portion (i.e., the position where the electrode is formed) deviates from the position of the portion from which the protective film is removed, and thereby the position of the exposed portion of the electrode deviates from the designed position so that characteristics of the semiconductor element deteriorates or an operation failure occurs. Consequently, it is possible to suppress the increase in manufacturing cost due to the lowering of the manufacturing yield of the semiconductor element.

Further, in the step of forming the ridge portion after forming the electrode layer, the electrode layer is etched to have the same planar form as the ridge portion. Therefore, it is possible to reduce the possibility that the top surface (i.e., the surface in contact with the electrode layer) of the ridge portion is oxidized or contaminated by impurities in the step of forming the ridge portion and other steps. Consequently, it is possible to reduce the possibility that the characteristics of the semiconductor element deteriorate due to such oxidation or contamination by impurities (e.g., that the drive voltage of the element rises), and the semiconductor element having good characteristics is formed.

Before forming the protective film, the end of the first film is retreated from the position of end of the second film. Therefore, it is possible to reduce the possibility that a part of the protective film is formed on the surface of the end of the first film in the step of forming the protective film. Therefore, it is possible to reduce the possibility of occurrence of such a problem that the first film to be removed cannot be removed sufficiently (and therefore the second film and a portion of the protective film formed on the top surface of the second film cannot be removed sufficiently) due to the fact that a part of the protective film is formed on the surface of the end of the first film. Accordingly, it is possible to reduce the possibility of occurrence of an operation failure in the semiconductor element due to the above problem. Consequently, it is possible to suppress the increase in manufacturing cost due to the lowering of manufacturing yield of the semiconductor element.

The second film is made of the material of which rate of the etching with the alkaline etchant or the mixed acid is smaller than that of the material forming the first film. Therefore, it is not necessary to perform additional processing such as heat treatment for selectively etching the first film with respect to the second film. Accordingly, the number of steps for manufacturing the semiconductor element can be reduced as compared with the case where the above additional processing is performed. Consequently, the manufacturing cost of the semiconductor element can be reduced.

In the above manufacturing method of the semiconductor element, the gallium nitride-containing semiconductor layer may be a semiconductor layer formed by epitaxial growth on a nonpolar or semipolar substrate. Also, the semipolar substrate may be made of a material having a crystalline structure of hexagonal crystal. The inventors have found from many experiments that, in the above case, the above problem (i.e., the problem that the oxidation and contamination with impurities occurs on the surface of gallium nitride-containing semiconductor layer to cause rising of the drive voltage of the produced element) becomes remarkable when the method uses the nonpolar or semipolar substrate, and more specifically the nonpolar or semipolar substrate of which plane direction of the main surface has an off angle with respect to {0001} C-plane in a range from 63° to 80° or from 100° to 117° (from a different point of view, the substrate having the plane direction [0001] inclined, with respect to the normal vector of the main surface, in a range from 63° to 80° or from 100° to 117°). Therefore, the invention can suppress the occurrence of the above problems when the gallium nitride-containing semiconductor layer is formed by the epitaxial growth on the nonpolar or semipolar substrate, and therefore is particularly effective in the above case.

The invention can reduce the manufacturing cost by preventing lowering of the manufacturing yield of the semiconductor element, and can provide the semiconductor element having good characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the following description, the same or corresponding portions bear the same reference numbers, and description thereof is not repeated.

First Embodiment

Referring to FIGS. 1 to 11, a manufacturing method of a compound semiconductor element according to the invention will be described below.

Figure 1:
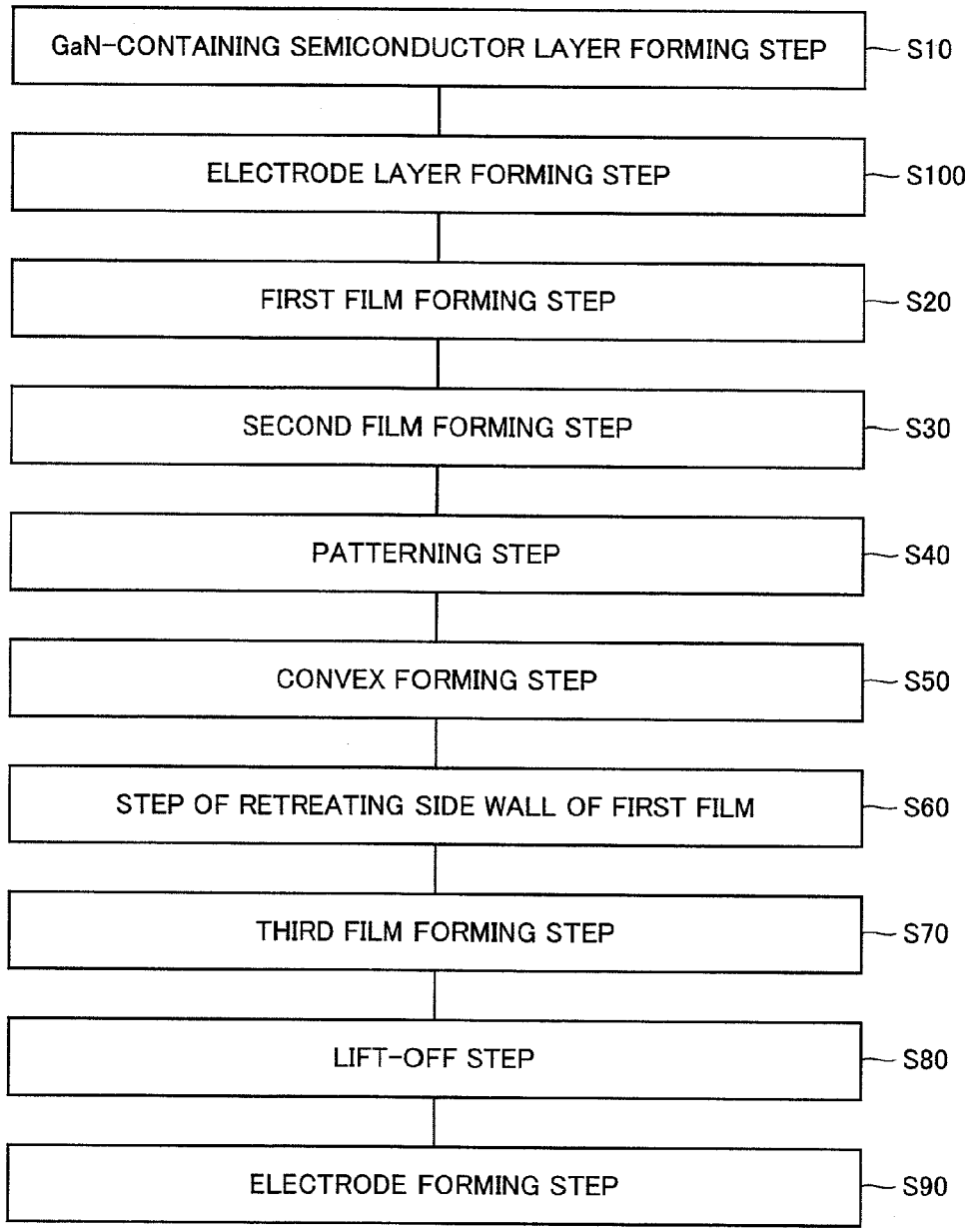
FIG. 1 is a flowchart showing a first embodiment of a manufacturing method of a compound semiconductor element according to the invention.
Figure 2:
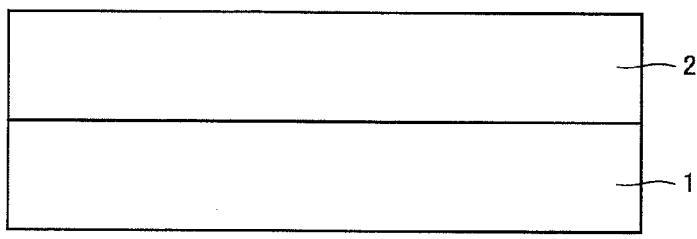
FIGS. 2 to 11 are schematic cross sections for illustrating various steps in the manufacturing method of the compound semiconductor element shown in FIG. 1, respectively.

In the manufacturing method of the compound semiconductor element according to the invention, as shown in FIG. 1, a step (S10) of forming a GaN-containing semiconductor element is first executed. In this step (S10), as shown in FIG. 2, a GaN-containing semiconductor layer 2 is first formed on a main surface of a substrate 1 by an epitaxial growth method or the like. Substrate 1 may be made of, e.g., GaN, sapphire or the like which allows formation of a GaN-containing semiconductor layer on its main surface. GaN-containing semiconductor layer 2 may have a structure in which a plurality of GaN-containing semiconductor layers are layered according to required characteristics of the compound semiconductor layer to be formed. For example, when a semiconductor laser element is to be formed as the semiconductor element, and GaN-containing semiconductor layer 2 has a structure in which substrate 1 is formed of a GaN substrate, GaN-containing semiconductor layer 2 may have such a structure that n- and p-type clad layers are formed on substrate 1, and an active layer is located between the n- and p-type clad layers. GaN-containing (gallium nitride-containing) semiconductor layer 2 may have any composition provided that it contains gallium (Ga) and nitrogen (N).

Substrate 1 may be a nonpolar substrate, or may be a semipolar substrate such as a GaN substrate that is made of a compound, and has a main surface having a plane direction inclined by a predetermined angle (off angle) with respect to a {0001} C-plane (i.e., having an off angle).

Then, an electrode layer forming step (S100) is executed. In this step (S100), an electrode layer 17 (see FIG. 3) allowing ohmic contact is formed on GaN-containing semiconductor layer 2. The electrode layer may be made of at least one material selected from a group containing Pd (palladium), Pt (platinum), Rh (rhodium), Os (osmium), Ir (iridium), Ni (nickel) and Au (gold). Electrode layer 17 may be formed by an arbitrary method such as an EB vapor deposition method or a sputter method. Electrode layer 17 has a thickness that can ensure the ohmic characteristics and does not impair close contact property. For example, electrode layer 17 desirably has a thickness from 0.005 µm to 0.1 µm, but may have a thickness outside such a range.

Then, a first film foaming step (S20) is executed. In this step (S20), an aluminum film (Al film 3) is formed as a first film on electrode layer 17. This Al film 3 may be formed by an arbitrary method such as a vapor deposition method or a sputter vapor deposition method. Al film 3 serving as the first film may have a thickness, e.g., from 0.05 µm to 1 µm (e.g., of 0.3 µm). The thickness of Al film 3 has the above lower limit of 0.05 µm because the thickness of Al film 3 equal to or larger than 0.05 µm allows execution of the lift-off of a mask layer 14 and the like without any problem in a lift-off step (S80) to be describe later.

Figure 3:
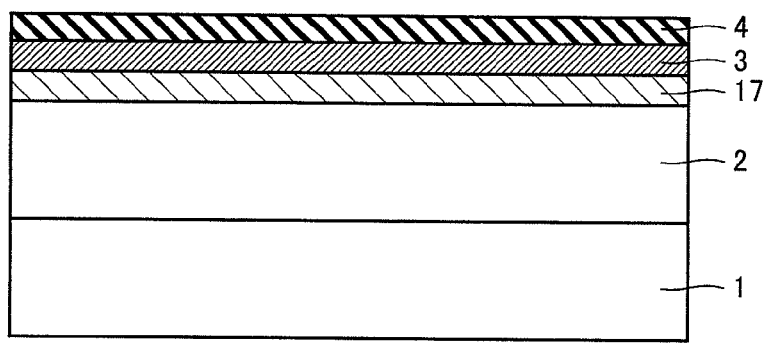

Then, a second film forming step (S30) is executed as shown in FIG. 1. In this step (S30), a silicon oxide film (SiO$_2$ film 4) is formed as a second film on Al film 3 described above. Consequently, a structure shown in FIG. 3 is formed. SiO$_2$ film 4 can be formed by an arbitrary method such as a CVD (Chemical Vapor Deposition) method, an EB (Electron Beam) vapor deposition method or a sputter method. SiO$_2$ film 4 may have a thickness, e.g., from 0.1 µm to 1 µm. The thickness of SiO$_2$ film 4 has the lower limit of 0.1 µm because 0.1 µm is the minimum thickness that can leave SiO$_2$ film 4 at the end of etching in the etching processing of a convex forming step (S50). The thickness of SiO$_2$ film 4 has the upper limit of 1 µm because 1 µm is the upper limit of the thickness that can end the patterning of SiO$_2$ film 4 before a resist film 5 disappears in a patterning step (S40).

Figure 4:
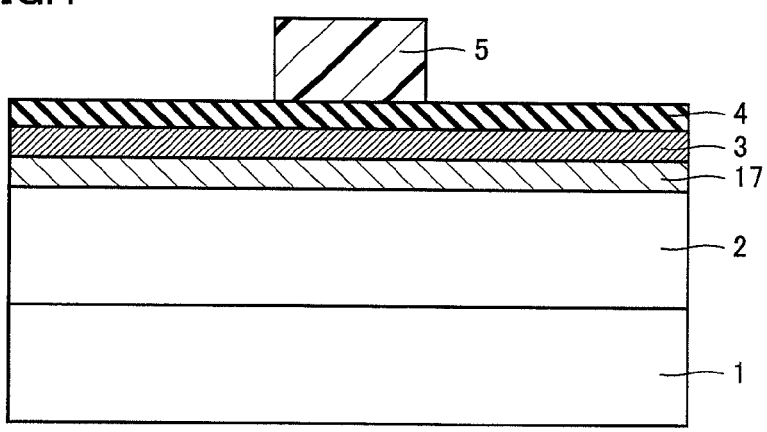

Then, the patterning step (S40) is executed as shown in FIG. 1. In this step (S40), a resist film is first formed on the surface of SiO$_2$ film 4. Thereafter, a predetermined pattern is transferred onto the resist film by a photolithography method. By executing the developing processing, resist film 5 having a predetermined pattern is formed on SiO$_2$ film 4 as shown in FIG. 4. Resist film 5 has a planar form corresponding to the planar form of the top surface of a ridge portion to be described later.

Figure 5:
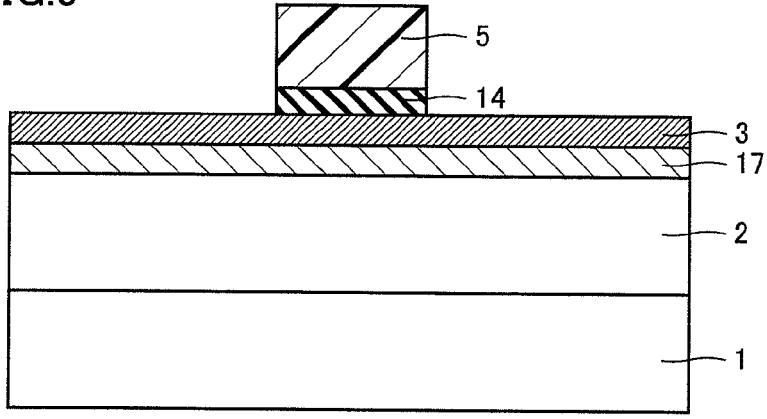

Then, the convex forming step (S50) is executed as shown in FIG. 1. In this step (S50), etching is performed to remove partially SiO$_2$ film 4 masked with foregoing resist film 5 so that the structure shown in FIG. 5 is formed. Thus, the above etching forms mask layer 14 formed of SiO$_2$ film 4 (see FIG. 4) under resist film 5. Mask layer 14 has the same planar form as resist film 5. The etching on SiO$_2$ film 4 employs an (Reactive Ion Etching) RIE using a fluorine-containing etching gas.

Figure 6:
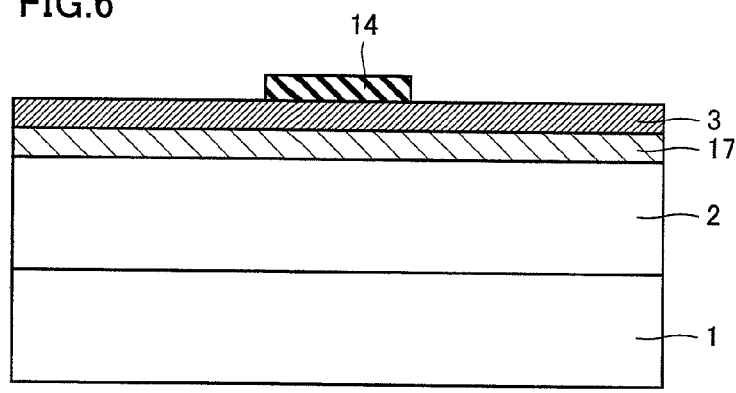

Then, resist film 5 is removed, e.g., by wet etching. Consequently, the structure shown in FIG. 6 is formed. Using mask layer 14 made of SiO$_2$ as a mask, etching is performed to remove partially Al film 3, electrode layer 17 and GaN-containing semiconductor layer 2. In this etching step, the RTE using chlorine-containing etching gas is performed to remove partially Al film 3, electrode layer 17 and GaN-containing semiconductor layer 2. Consequently, a ridge portion 12 that is a convex portion formed of an Al film 13, an electrode 7 and a portion of the GaN-containing semiconductor layer is formed under mask layer 14. In this manner, the structure shown in FIG. 7 can be formed. A height of ridge portion 12 serving as the convex portion (i.e., a height from a flat top surface of GaN-containing semiconductor layer 2 neighboring to ridge portion 12 to the top surface of ridge portion 12) can be arbitrarily determined by adjusting process conditions such as a processing time of the foregoing etching.

Figure 7:
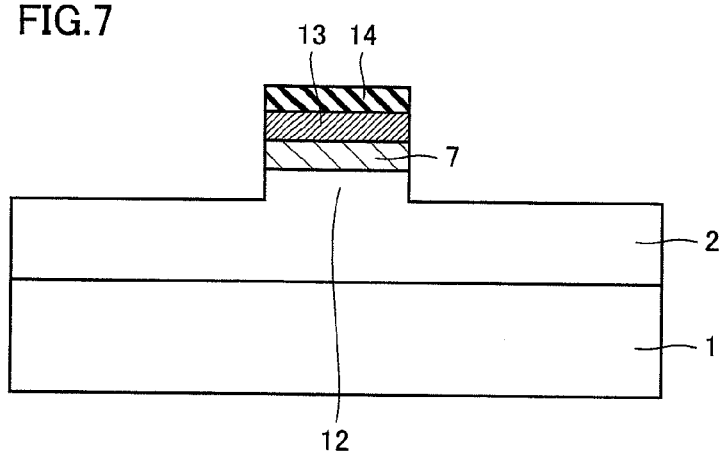
Figure 8:
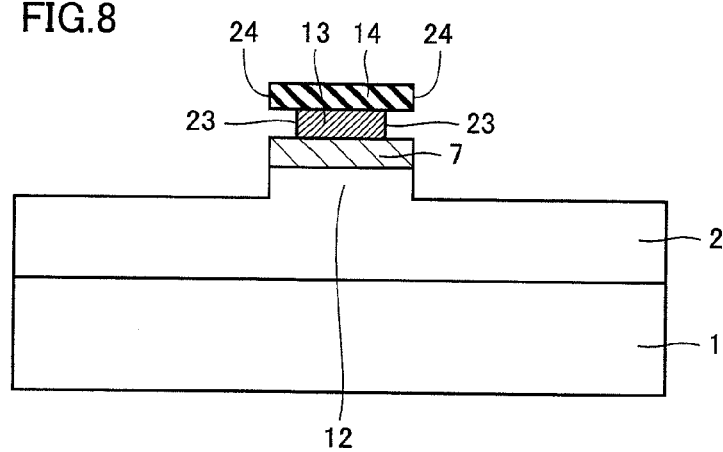

Then, as shown in FIG. 1, a step (S60) of retreating a side wall of the first film is executed. This step (S60) may employ an arbitrary etching method performed under such conditions that an etching rate of the first film, i.e., Al film 13 is larger than the etching rate of mask layer 14 (and preferably electrode 7) formed of the SiO$_2$ film serving as the second film. For example, the substrate having the structure shown in FIG. 7 is immersed in an alkaline solution (e.g., Semicoclean 23 manufactured by Furuuchi Chemical Corporation) so that the side wall of Al film 13 can be partially removed. In this manner, the position of side wall 23 of Al film 13 is retreated inward with respect to the position of a side wall 24 of mask layer 14. Consequently, the structure shown in FIG. 8 is formed. Side wall 23 of Al film 13 is retreated inward from side wall 24 of mask layer 14 by a retreat amount (i.e., a distance between side wall 24 of mask layer 14 and side wall 23 of Al film 13) that is in a range preferably from 0.05 μm to 1 μm, and more preferably from 0.1 μm to 0.5 μm.

Figure 9:
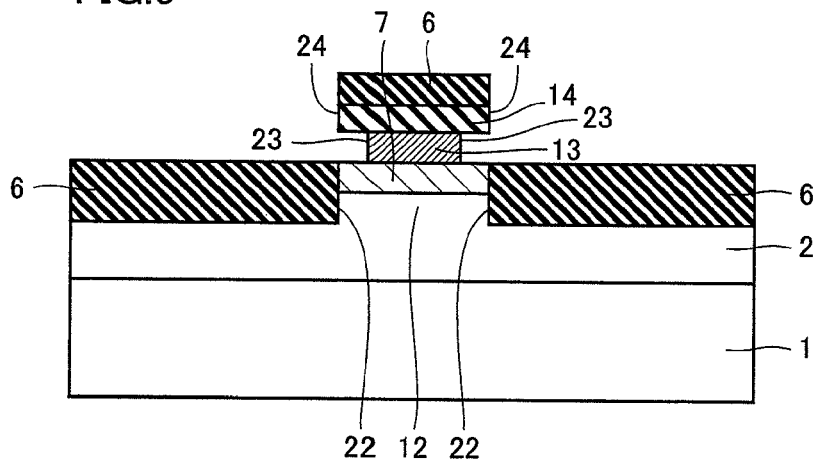

Then, a third film forming step (S70) shown in FIG. 1 is executed. In this step (S70), an SiO$_2$ film 6 that is a third film is formed on the side wall of ridge portion 12, the side wall of electrode 7, the top surface of GaN-containing semiconductor layer 2 except for ridge portion 12 and the top surface of mask layer 14. Consequently, a structure shown in FIG. 9 is formed. SiO$_2$ film 6 serving as the protective film has a thickness, e.g., from 0.05 μm to 0.5 μm.

SiO$_2$ film 6 may be formed by an arbitrary method such as the foregoing EB vapor deposition method of sputter vapor deposition method. Since the position of side wall 23 of Al film 13 is retreated from the position of side wall 24 of mask layer 14, SiO$_2$ film 6 is not formed on side wall 23 of Al film 13.

Figure 10:
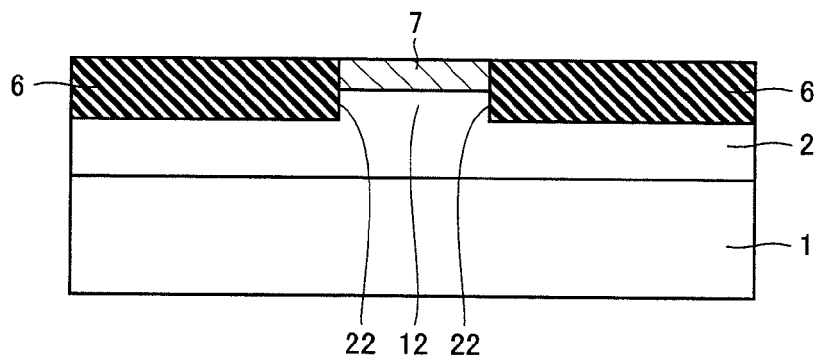

Then, the lift-off step (S80) is executed. In this step (S80), the structure shown in FIG. 9 is immersed in an alkaline solution (e.g., Semicoclean 23 manufactured by Furuuchi Chemical Corporation). Consequently, the alkaline solution performs selective etching on Al film 13 to remove Al film 13. When Al film 13 is removed, mask layer 14 formed of the SiO$_2$ film and located on Al film 13 as well as SiO$_2$ film 6 formed on mask layer 14 are removed simultaneously with it. Consequently, a structure shown in FIG. 10 is formed. As can be seen from FIG. 10, such a state is kept that SiO$_2$ film 6 is formed on the side walls of ridge portion 12 and electrode 7. As can be seen from the steps described above, Al film 13 serves as a mask for forming ridge portion 12 as well as a mask for the lift-off performed for removing a portion of SiO$_2$ film 6 located on ridge portion 12. Therefore, the position of the top surface of ridge portion 12 substantially accurately matches the region where SiO$_2$ film 6 is removed by the lift-off method, and no deviation occurs in the positional relationship between them. Therefore, it is possible to provide the semiconductor element having the ridge portion of the accurate structure.

Further, electrode layer 17 is formed before forming ridge portion 12. Then, in the convex forming step (S50) for forming ridge portion 12, the etching is likewise performed on electrode layer 17 to have the same planar form as ridge portion 12 so that electrode 7 is formed. Therefore, it is possible to reduce the possibility that the top surface of ridge portion 12 (i.e., the surface in contact with electrode layer 17) is oxidized or contaminated by impurities in this convex forming step (S50) and others. Consequently, it is possible to reduce the possibility that the characteristics of the semiconductor element deteriorate due to such oxidation or contamination by impurities (e.g., that the drive voltage of the element rises), and the semiconductor element having good characteristics is formed.

Figure 11:
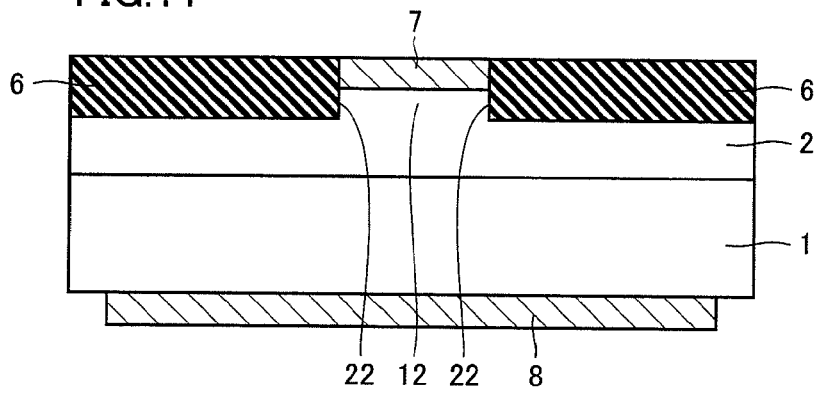

Then, an electrode forming step (S90) is executed. More specifically, as shown in FIG. 11, other electrode 8 is formed on a rear side of substrate 1 opposite to the main surface on which GaN-containing semiconductor layer 2 is formed. The method of manufacturing electrode 8 may employ a known arbitrary method such as lift-off For example, a resist film having an opening pattern in a region where electrode 8 is to be formed is formed on the rear surface of substrate 1, and a conductor film for forming electrode 8 is formed on this resist film. The resist film is removed by the wet etching so that electrode 8 can be formed.

Subsequently to the above steps, substrate 1 is divided into individual chips by a dicing saw or the like after forming a resonator plane by cleavage. Thereby, the semiconductor element according to the invention can be formed.

Instead of SiO$_2$, mask layer 14 may be made of one of silicon oxide (SiO), silicon nitride (SiN), zirconium oxide (ZrO$_2$), tantalum oxide (Ta$_2$O$_3$), lanthanum oxide (La$_2$O$_5$), ceric oxide (CeO$_3$) and hafnium oxide (HfO$_2$), or may be made of two or more of these materials. Alternatively, mask layer 14 may be formed of one of a silicon oxide film (SiO film), silicon nitride film (SiN film), zirconium oxide film (ZrO$_2$ film), tantalum oxide film (Ta$_2$O$_3$ film), lanthanum oxide film (La$_2$O$_5$ film), ceric oxide film (CeO$_3$ film) and hafnium oxide film (HfO$_2$ film), or may be formed of a composite film of these films.

Second Embodiment

Figure 12:
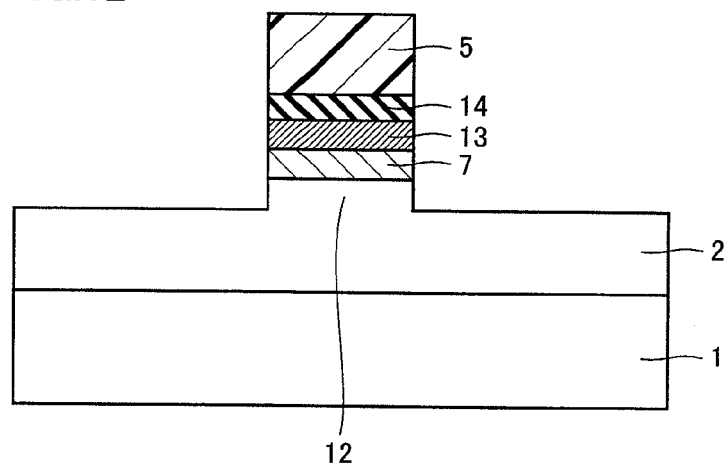
FIG. 12 is a schematic cross section for illustrating a second embodiment of the manufacturing method of the compound semiconductor element according to the invention.

Referring to FIG. 12, a second embodiment of the manufacturing method of the compound semiconductor element according to the invention will be described below.

The second embodiment of the manufacturing method of the compound semiconductor element according to the invention basically includes substantially the same steps as the manufacturing method of the compound semiconductor element already described with reference to FIGS. 1 to 11 except for forming the layer used as a mask when forming ridge portion 12. More specifically, in the second embodiment of the manufacturing method of the compound semiconductor element according to the invention, steps (S10-S40) in the manufacturing method shown in FIG. 1 are first executed substantially in the same manner. Consequently, the structure shown in FIG. 4 is formed. Similarly to the case of the foregoing first embodiment, resist film 5 is used as the mask, and the RIE using a fluorine-containing etching gas is executed to remove partially $SiO_2$ film 4 so that the structure shown in FIG. 5 is formed.

In the manufacturing method of the compound semiconductor element according to the second embodiment, processing is executed to perform etching on Al film 3, electrode layer 17 and GaN-containing semiconductor layer 2 without removing resist film 5, in contrast to the first embodiment. More specifically, the RIE with chlorine-containing etching gas is performed to remove partially Al film 3, electrode layer 17 and GaN-containing semiconductor layer 2, using resist film 5 and mask layer 14 as a mask. Consequently, a structure shown in FIG. 12 is formed.

After forming ridge portion 12 as described above, resist film 5 is removed by the wet etching or the like. Then, steps (S60-S90) in the first embodiment are executed to provide the compound semiconductor element shown in FIG. 11 is formed.

Third Embodiment

A third embodiment of the manufacturing method of the compound semiconductor element according to the invention basically has the same structure as the manufacturing method of the compound semiconductor element according to the invention shown in FIGS. 1 to 11, except for that the etchant used in the step (S60) of retreating the side wall of the first film and the lift-off step (S80) is not an alkaline solution but is a mixed acid made of phosphoric acid, nitric acid, acetic acid and water. The mixed acid may be a mixture of 80 wt. % of phosphoric acid, 5 wt. % of nitric acid, 10 wt. % of acetic acid and water. This can achieve substantially the same effect as the first embodiment of the invention.

In the case where the mixed acid is used as described above, mask layer 14 may likewise be made of a material other than $SiO_2$, and it may be made of one of silicon oxide (SiO), silicon nitride (SiN), zirconium oxide ($ZrO_2$), tantalum oxide ($Ta_2O_3$), lanthanum oxide ($La_2O_5$), ceric oxide ($CeO_3$) and hafnium oxide ($HfO_2$), or may be made of two or more of these materials. Alternatively, instead of $SiO_2$ film 6, mask layer 14 may be formed of one of an SiO film, SiN film, $ZrO_2$ film, $Ta_2O_3$ film, $La_2O_5$ film, $CeO_3$ film and $HfO_2$ film, or may be formed of a composite film of them.

In the case where the mixed acid is not used as described above, Al film 3, electrode layer 17 and GaN-containing semiconductor layer 2 may be etched without removing resist film 5 as shown in FIG. 12.

Fourth Embodiment

Referring to FIGS. 13 to 19, the manufacturing method of the compound semiconductor element according to the invention will be described below.

The fourth embodiment of the manufacturing method of the compound semiconductor element according to the invention basically has the same steps as the manufacturing method of the compound semiconductor element already described with reference to FIGS. 1 to 11, but differs therefrom in that a film (an Au film 9 in FIG. 13) made of gold is formed as a coating film over Al film 3 after forming Al film 3 as the first film and before forming $SiO_2$ film 4 as the second film. This will be described below more specifically.

Figure 13:
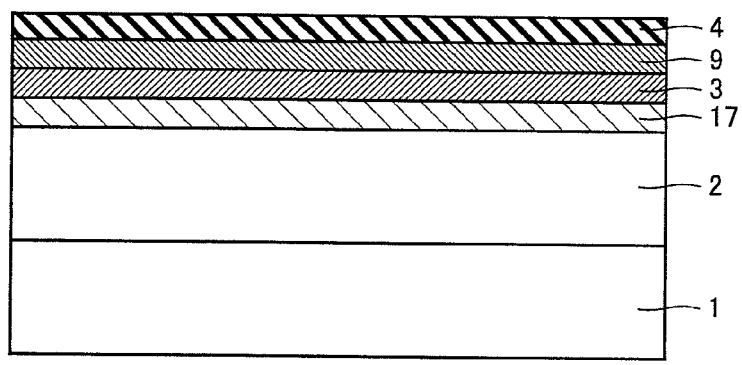
FIGS. 13 to 19 are schematic cross sections for illustrating various steps in a fourth embodiment of the manufacturing method of the compound semiconductor element according to the invention, respectively.

Similarly to the first embodiment of the manufacturing method of the compound semiconductor element according to the invention, a GaN-containing semiconductor layer forming step (S10) is executed (see FIG. 1). In this step (S10), the epitaxial growth method or the like is executed to form GaN-containing semiconductor layer 2 on the main surface of substrate 1 as shown in FIG. 13.

Then, an electrode layer forming step (S100) is executed as shown in FIG. 1. In this step (S100), electrode layer 17 (see FIG. 13) is formed on the main surface of GaN-containing semiconductor layer 2 to allow the ohmic contact with GaN-containing semiconductor layer 2. Electrode layer 17 may be made of an arbitrary material provided that it allows the ohmic contact with GaN-containing semiconductor layer 2. Electrode layer 17 may have a thickness of 0.1 μm or less, but may be thicker than it. An arbitrary method such as an EB vapor deposition method or a sputtering method may be employed as a method for forming electrode layer 17.

Then, the first film forming step (S20) is executed as shown in FIG. 1. In this step (S20), Al film 3 (see FIG. 13) is formed as the first film on electrode layer 17. An arbitrary method such as an EB vapor deposition method or a sputtering method may be employed as a method for forming Al film 3. Al film 3 may have a thickness, e.g., of 0.3 μm.

A coating film forming step is then executed. In this coating film forming step, Au film 9 (see FIG. 13) is formed as a coating film on Al film 3. Au film 9 may be formed by an arbitrary method. Au film 9 may have a thickness from 0.005 μm to 0.05 μm (e.g., of about 0.01 μm).

Then, the second film forming step (S30) shown in FIG. 1 is executed. In this step (S30), $SiO_2$ film 4 serving as the second film is formed on Au film 9 described above. Consequently, a structure shown in FIG. 13 is formed.

Figure 14:
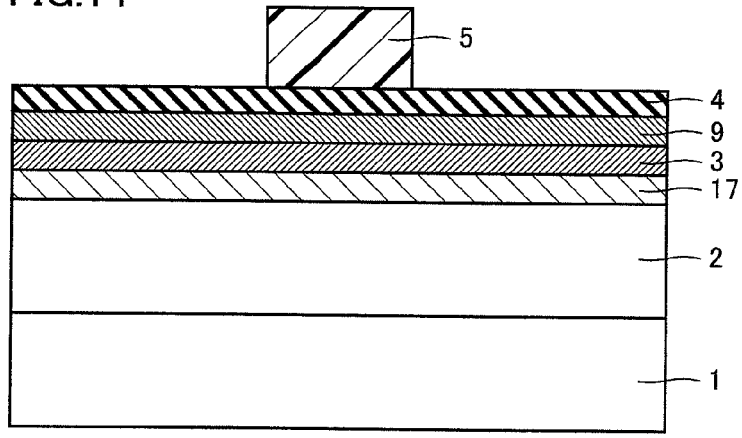

The patterning step (S40) is executed similarly to the manufacturing method shown in FIG. 1. Consequently, resist film 5 having a predetermined pattern is formed on $SiO_2$ film 4 as shown in FIG. 14. Resist film 5 has a planar form corresponding to that of the top surface of the ridge portion to be described later.

Figure 15:
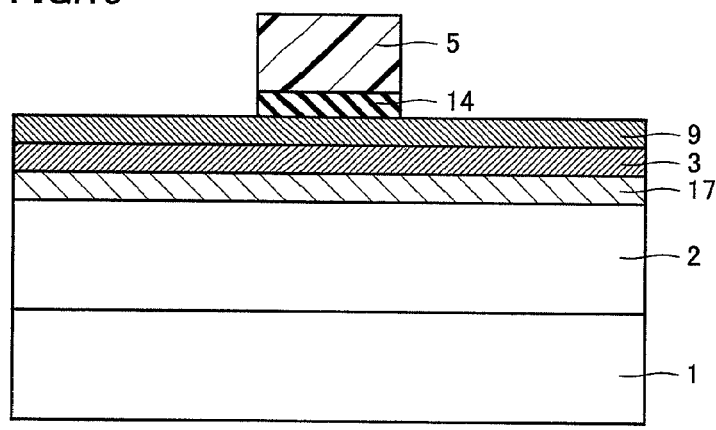

Then, the convex forming step (S50) is executed similarly to the manufacturing method shown in FIG. 1. In this step (S50), $SiO_2$ film 4 is partially removed by the etching using foregoing resist film 5 as a mask so that a structure shown in FIG. 15 is formed. Thus, the above etching forms mask layer 14 (see FIG. 15) formed of $SiO_2$ film 4 (see FIG. 14) under resist film 5. Mask layer 14 has the same planar form as resist film 5. The etching of $SiO_2$ film 4 is performed by the Reactive Ion Etching (RIE) using a fluorine-containing etching gas.

Figure 16:
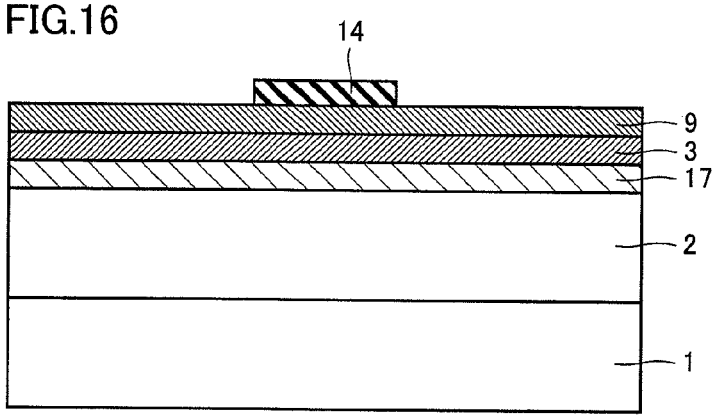
Figure 17:
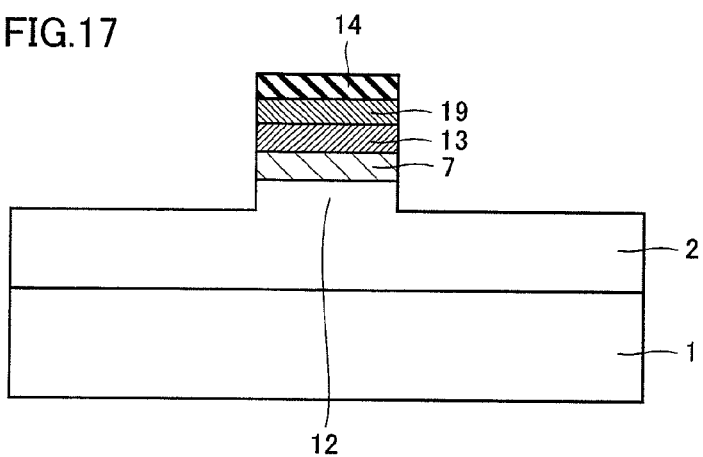

Thereafter, resist film 5 is removed by wet etching or the like. Consequently, a structure shown in FIG. 16 is formed. Using mask layer 14 as a mask, Au film 9, Al film 3 and GaN-containing semiconductor layer 2 are partially removed by the etching. In this etching step, the RIE using a chlorine-containing etching gas is performed to remove partially Au film 9, Al film 3, electrode layer 17 and GaN-containing semiconductor layer 2. Consequently, an Au film 19, Al film 13, electrode 7 and ridge portion 12a that is a part of the GaN-containing semiconductor layer and serves as the convex are formed under mask layer 14 as shown in FIG. 17.

In the foregoing step (S50), mask layer 14 is formed, and the etching of Au film 9 is performed continuously to the etching of Al film 3 and GaN-containing semiconductor layer 2. However, the etching of Au film 9 may be performed according to different timing. For example, in the etching step for forming mask layer 14 illustrated in FIG. 15, the etching may be continuously performed to remove partially the Au film masked with resist film 5 so that Au film 19 having substantially the same planar pattern as resist film 5 may be formed. In this case, the etching of Au film 9 is not performed in the step of partially etching Al film 3, electrode layer 17 and GaN-containing semiconductor layer 2 already illustrated in FIG. 17.

Figure 18:
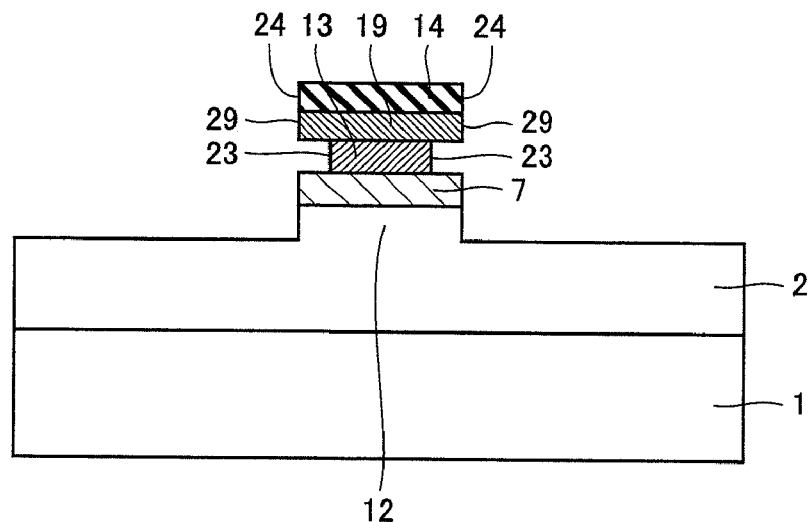

Similarly to the manufacturing method shown in FIG. 1, the step (S60) of retreating the side wall of the first film is executed. This step (S60) can employ an arbitrary etching method executed under the conditions that the etching rate of Al film 13 serving as the first film is larger than that of mask layer 14 formed of $SiO_2$ film serving as the second film (and preferably Au film 19, and further preferably electrode 7). For example, the substrate having the structure shown in FIG. 17 is immersed in an alkaline solution (e.g., Semicoclean 23 manufactured by Furuuchi Chemical Corporation) so that the side wall of Al film 13 can be partially removed. In this manner, the position of side wall 23 of Al film 13 is retreated inward with respect to the positions of side wall 24 of mask layer 14 and a side wall 29 of Au film 19 (and further, the position of electrode 7) so that the structure shown in FIG. 18 is formed.

Figure 19:
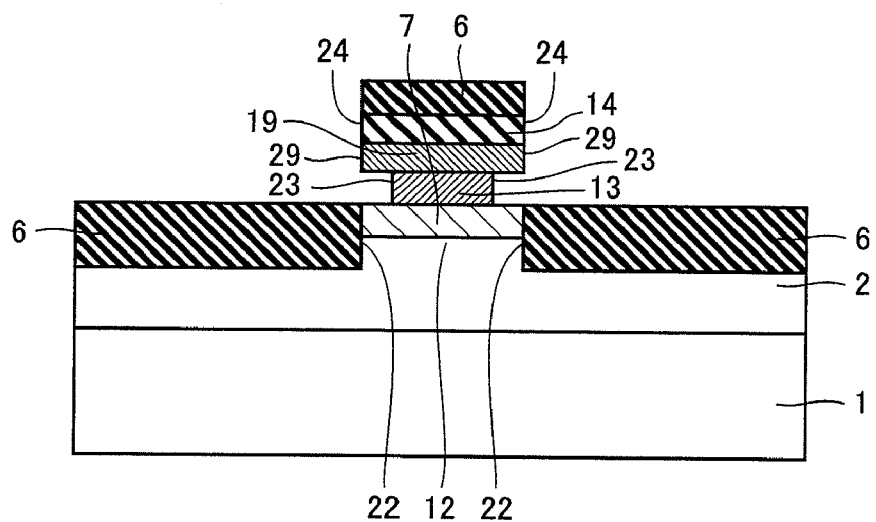

Similarly to the manufacturing method shown in FIG. 1, the third film forming step (S70) is executed. In this step (S70), as shown in FIG. 19, $SiO_2$ film 6 serving as the third film is formed on the side wall of ridge portion 12, the side wall of electrode 7, the top surface of GaN-containing semiconductor layer 2 other than ridge portion 12 and the top surface of mask layer 14.

In the above processing, $SiO_2$ film 6 may be formed by an arbitrary method such as the foregoing EB vapor deposition method or the sputter vapor deposition method. Since side wall 23 of Al film 13 is retreated inward from the position of side wall 24 of mask layer 14, $SiO_2$ film 6 is not formed on side wall 23 of Al film 13.

Then, the lift-off step (S80) is executed similarly to the manufacturing method shown in FIG. 1. In this step (S80), a specimen of a structure shown in FIG. 19 is immersed in an alkaline solution (e.g., Semicoclean 23 manufactured by Furuuchi Chemical Corporation). Consequently, the alkaline solution selectively etches Al film 13 to remove it. When Al film 13 is removed, mask layer 14 and Au film 19 located on Al film 13 as well as $SiO_2$ film 6 formed on mask layer 14 are simultaneously removed with it. Consequently, the structure shown in FIG. 10 is formed. Thereafter, the foregoing step (S90) in the first embodiment (see FIG. 1) is executed to provide the compound semiconductor element shown in FIG. 11.

In the step (S60) of retreating the side wall of the first film and the lift-off step (S80) already described, the etchant may not be the alkaline solution, and may be the mixed acid made of phosphoric acid, nitric acid, acetic acid and water used in the third embodiment of the invention already described.

In the fourth embodiment described above, Au film 9 is formed as the coating film on Al film 3. However, a coating film of titanium, i.e., a Ti film may be formed instead of Au film 9. Thus, instead of Au film 9, a Ti film 9 is formed as the coating film formed between the first and second films, i.e., Al film 3 and $SiO_2$ film 4. This structure further improves the close contact properties between the first film, i.e., Al film 3 and the coating film, and between the second film, i.e., $SiO_2$ film 4 and the coating film, as compared with the case of using Au film 9. Thus, it is possible to reduce the possibility that, during the dry etching using the mask that is formed of electrode layer 17, Al film 3 that is the first film, the coating film and $SiO_2$ film 4 that is the second film, the end of the mask becomes coarse and thereby the end surface of the formed ridge portion 12 becomes coarse. In the RIE that uses the chlorine-containing etching gas and is performed to remove partially Ti film 9, Al film 3, electrode layer 17 and GaN-containing semiconductor layer 2, minute residues of Ti film 9 are unlikely to remain on the surface of the etched ridge portion so that lowering of the yield of the semiconductor element can be suppressed. Naturally, when the coating film is made of titanium and the lift-off step is executed, the coating film will form a Ti film 19.

When Ti film 9 is used as the coating film instead of Au film 9, all the other conditions such as the film deposition method, the deposition thickness and the thicknesses of the first and second films, i.e., Al film 3 and $SiO_2$ film 4 may be the same as those in the case where foregoing Au film 9 is used as the coating film.

In the first to fourth embodiments already described, the lift-off method may be used in the second film forming step (S30) and the patterning step (S40). More specifically, the processing is performed to form, on the Al film 3 that is the first film, a resist film having an opening pattern located in the region where ridge portion 12 is to be formed, and $SiO_2$ film 4 is formed as the second film on this resist film. In this processing, a part of $SiO_2$ film 4 (i.e., a portion that will form mask layer 14) is formed inside the opening pattern and is in contact with Al film 3. By removing the resist film by the wet etching, the portion of $SiO_2$ film 4 except for the portion that will form mask layer 14 is removed together with the resist film. In this manner, the structure shown in FIG. 6 may be formed.

Distinctive structures of the invention will be enumerated below although some of them are already described in connection with the embodiments.

The manufacturing method of the semiconductor element according to the invention executes the following steps. First, the method executes the step (GaN-containing semiconductor layer forming step (S10)) of preparing the gallium nitride-containing semiconductor layer (GaN-containing semiconductor layer 2) forming the semiconductor element. It executes the step (electrode layer forming step (S100)) of forming electrode layer 17 on GaN-containing semiconductor layer 2. It executes the step (first film forming step (S20)) of forming the first film (Al film 3) on electrode layer 17. It executes the step (second film forming step (S30)) and the patterning step (S40)) of forming the second film (mask layer 14) having the pattern and made of the material of which rate of etching with alkaline etchant is smaller than that of the material of Al film 3. It executes the step (convex forming step (S50)) of forming ridge portion 12 in GaN-containing semiconductor layer 2 in the region located under the second film (mask layer 14) by performing the etching to remove partially Al film 3, electrode layer 17 and GaN-containing semiconductor layer 2 masked with the second film (mask layer 14).

The method executes the step (the step (S60) of retreating the side wall of the first film) of retreating the position of the end surface of Al film 13 (the position of side wall 23) with respect to the position of the end surface of mask layer 14 (the position of side wall 24) by removing the end of Al film 13 (see FIG. 7) located on ridge portion 12 by the etching using the alkaline etchant. It executes the step (third film forming step (S70)) of forming, on the side surface of ridge portion 12 and the top surface of mask layer 14, the protective film (SiO$_2$ film 6) made of the material of which rate of etching with the alkaline etchant is smaller than that of the material forming Al films 3 and 13. It executes the step (lift-off step (S80)) of removing Al film 13 by the etching using the alkaline etchant, and thereby removing mask layer 14 and a portion of SiO$_2$ film 6 formed on the top surface of mask layer 14.

In the above method, mask layer 14 is used as the mask for forming ridge portion 12, and mask layer 14 (having the top surface on which the portion of SiO$_2$ film 6 serving as the protective film is formed) will be removed simultaneously with the removal of Al film 13 for exposing the top surface of ridge portion 12. Therefore, the portion of SiO$_2$ film 6 can be reliably removed from the top surface of ridge portion 12. Accordingly, the possibility that the position of the top surface of ridge portion 12 deviates from the position of the portion of SiO$_2$ film 6 to be removed can be small, as compared with the case where a new resist pattern or the like independent of mask layer 14 used for forming ridge portion 12 is formed for removing the portion of SiO$_2$ film 6 from the top surface of ridge portion 12. Accordingly, it is possible to prevent occurrence of such a problem that the area of the exposed portion of electrode 7 (i.e., the portion of electrode 7 overlapping a portion from which SiO$_2$ film 6 is removed) becomes small due to the fact that the position of the top surface of ridge portion 12 (i.e., the position where electrode 7 is formed) deviates from the position of the portion from which SiO$_2$ film 6 is removed, and the external interconnection cannot be connected to electrode 7 without difficulty due to the above small area. Consequently, it is possible to suppress the increase in manufacturing cost due to the lowering of the manufacturing yield of the semiconductor element.

Further, in the convex forming step (S50) of forming ridge portion 12 after forming electrode layer 17, electrode layer 17 is etched to have the same planar form as ridge portion 12. Therefore, it is possible to reduce the possibility that the top surface (i.e., the surface in contact with electrode layer 17) of ridge portion 12 is oxidized or contaminated by impurities in this step (S50) of forming ridge portion 12 and other steps. Consequently, it is possible to reduce the possibility that the characteristics of the semiconductor element deteriorate due to such oxidation or contamination by impurities (e.g., the possibility that the drive voltage of the element rises), and the semiconductor element having good characteristics can be formed.

Before forming SiO$_2$ film 6 as the protective film, side wall 23 of Al film 13 is retreated from the position of side wall 24 of mask layer 14. Therefore, it is possible to reduce the possibility that a part of SiO$_2$ film 6 is formed on side wall 23 of Al film 13 in the step of forming SiO$_2$ film 6. Therefore, it is possible to reduce the possibility of occurrence of such a problem that Al film 13 to be removed cannot be removed sufficiently (and therefore mask layer 14 and a portion of SiO$_2$ film 6 formed on the top surface of mask layer 14 cannot be removed sufficiently) due to the fact that a part of SiO$_2$ film 6 is formed on side wall 23 of Al film 13. Accordingly, it is possible to reduce the possibility of occurrence of an operation failure in the semiconductor element due to the above problem. Consequently, it is possible to suppress the increase in manufacturing cost due to the lowering of manufacturing yield of the semiconductor element.

Mask layer 14 is made of the material (SiO$_2$) of which rate of the etching with the alkaline etchant is smaller than that of the material (Al) forming Al film 13. Therefore, it is not necessary to perform additional processing such as heat treatment for selectively etching Al film 13 with respect to mask layer 14. Accordingly, the number of steps for manufacturing the semiconductor element can be reduced as compared with the case where the above additional processing is performed. Consequently, the manufacturing cost of the semiconductor element can be reduced.

The manufacturing method of the semiconductor element according to the invention executes the following steps. First, the method executes the step (GaN-containing semiconductor layer forming step (S10)) of preparing the gallium nitride-containing semiconductor layer (GaN-containing semiconductor layer 2) forming the semiconductor element. It executes the step (electrode layer forming step (S100)) of forming electrode layer 17 on GaN-containing semiconductor layer 2. It executes the step (first film forming step (S20)) of forming the first film (Al film 3) on electrode layer 17. It executes the step (second film forming step (S30)) and the patterning step (S40)) of forming the second film (mask layer 14) having the pattern and made of the material of which rate of etching with mixed acid made of phosphoric acid, nitric acid, acetic acid and water is smaller than that of the material of Al film 3. It executes the step (convex forming step (S50)) of forming ridge portion 12 in GaN-containing semiconductor layer 2 in the region located under the second film (mask layer 14) by performing the etching to remove partially Al film 3, electrode layer 17 and GaN-containing semiconductor layer 2 masked with the second film (mask layer 14).

The method executes the step (the step (S60) of retreating the side wall of the first film) of retreating the position of the end surface of Al film 13 (the position of side wall 23) with respect to the position of the end surface of mask layer 14 (the position of side wall 24) by removing the end of Al film 13 located on the ridge portion by the etching using the mixed acid. It executes the step (third film forming step (S70)) of forming, on the side surface of ridge portion 12 and the top surface of mask layer 14, the protective film (SiO$_2$ film 6) made of the material of which rate of etching with the mixed acid is smaller than that of the material forming Al films 3 and 13. It executes the step (lift-off step (S80)) of removing Al film 13 by the etching using the mixed acid, and thereby removing mask layer 14 and a portion of SiO$_2$ film 6 formed on the top surface of mask layer 14.

In the above method, mask layer 14 is used as the mask for forming ridge portion 12, and mask layer 14 (having the top surface on which the portion of SiO$_2$ film 6 is formed) will be removed simultaneously with the removal of Al film 13 for exposing the top surface of ridge portion 12. Therefore, the portion of SiO$_2$ film 6 can be reliably removed from the top surface of ridge portion 12. Accordingly, the possibility that the position of the top surface of ridge portion 12 deviates from the position of the portion of SiO$_2$ film 6 to be removed can be small, as compared with the case where a new resist pattern or the like independent of mask layer 14 used for forming ridge portion 12 is formed for removing the portion of SiO$_2$ film 6 from the top surface of ridge portion 12. Accordingly, it is possible to prevent occurrence of such a problem that the area of the exposed portion of electrode 7 (i.e., the portion of electrode 7 overlapping a portion from which SiO$_2$ film 6 is removed) becomes small due to the fact that the position of the top surface of ridge portion 12 (i.e., the position where electrode 7 is formed) deviates from the position of the portion from which SiO$_2$ film 6 is removed, and the external interconnection cannot be connected to electrode 7 without difficulty due to the above small area. Consequently, it is possible to suppress the increase in manufacturing cost due to the lowering of the manufacturing yield of the semiconductor element.

Further, in the convex forming step (S50) of forming ridge portion 12 after forming electrode layer 17, electrode layer 17 is etched to have the same planar form as ridge portion 12. Therefore, it is possible to reduce the possibility that the top surface of ridge portion 12 is oxidized or contaminated by impurities in this step (S50) of forming ridge portion 12 and other steps. Consequently, it is possible to reduce the possibility that the characteristics of the semiconductor element deteriorate due to such oxidation or contamination by impurities, and the semiconductor element having good characteristics can be formed.

Before forming SiO$_2$ film 6, side wall 23 of Al film 13 is retreated inward from the position of side wall 24 of mask layer 14. Therefore, it is possible to reduce the possibility that a part of SiO$_2$ film 6 is formed on side wall 23 of Al film 13 in the step of forming SiO$_2$ film 6. Therefore, it is possible to reduce the possibility of occurrence of such a problem that Al film 13 to be removed cannot be removed sufficiently due to the fact that a part of SiO$_2$ film 6 is formed on side wall 23 of Al film 13. Accordingly, it is possible to reduce the possibility of occurrence of an operation failure in the semiconductor element due to the above problem. Consequently, it is possible to suppress the increase in manufacturing cost due to the lowering of manufacturing yield of the semiconductor element.

Mask layer 14 is made of the material (SiO$_2$) of which rate of the etching with the mixed acid is smaller than that of the material (Al) forming Al film 13. Therefore, it is not necessary to perform additional processing such as heat treatment for selectively etching Al film 13 with respect to mask layer 14. Accordingly, the number of steps for manufacturing the semiconductor element can be reduced as compared with the case where the above additional processing is performed. Consequently, the manufacturing cost of the semiconductor element can be reduced.

The above manufacturing method of the semiconductor element may use the lift-off method in the steps (the second film forming step (S30) and the patterning step (S40)) of forming mask layer 14 as the second film. Thereby, mask layer 14 having the predetermined pattern can be made of the material that does not allow etching without difficulty. Thereby, the material of mask layer 14 can be selected more flexibly.

In the above manufacturing method of the semiconductor element, the first film is made of aluminum. Mask layer 14 forming the second film may be at least one material selected from a group containing silicon dioxide, silicon oxide, silicon nitride, zirconium oxide, tantalum oxide, lanthanum oxide, ceric oxide and hafnium oxide. Further, instead of the silicon dioxide, the material of the protective film corresponding to SiO$_2$ film 6 may be at least one material selected from a group containing silicon oxide, silicon nitride, zirconium oxide, tantalum oxide, lanthanum oxide, ceric oxide and hafnium oxide.

In this case, the aluminum, i.e., the metal exhibiting a higher rate of etching with the alkaline etchant or the mixed acid than the protective film formed of mask layer 14 made of the oxide and SiO$_2$ film 6 is used as the material of the first film corresponding to Al film 3. Therefore, the manufacturing method of the semiconductor element according to the invention can be implemented reliably.

The above manufacturing method of the semiconductor element may further include a step of forming a coating film (Au film 9 or Ti film 9) on the first film (Al film 3) after the first film forming step (S20) shown in FIG. 13 and before the second film forming step (S30). The above manufacturing method of the semiconductor element may further include a step of partially removing the coating film (Au film 9 or Ti film 9) to have substantially the same pattern as the second film (mask layer 14) as shown in FIG. 17. Consequently, Au film 19 or Ti film 19 having substantially the same pattern as mask layer 14 is formed as shown in FIG. 17. In the step (lift-off step (S80)) of removing a part of the protective film (SiO$_2$ film 6), Au film 19 serving as the coating film located on Al film 3 is likewise removed. The step of partially removing the coating film (Au film 9 or Ti film 9) may be executed continuously to the step of forming ridge portion 12 as shown in FIG. 17. However, prior to the step of forming ridge portion 12, it may be performed continuously to the step of forming the second film having the pattern (i.e., continuously to the etching for forming mask layer 14 in the patterning step (S40)).

In this manner, Au film 9 or Ti film 9 covers the surface of Al film 3 serving as the first film so that it is possible to protect the surface of Al film 3 from damages by the step of forming the second film (SiO$_2$ film 4). Particularly, in the structure having ridge portion 12 of a reduced width, if the surface of Al film 3 is damaged (e.g., concave and convex portions are formed due to the step of forming the second film), it is difficult to form ridge portion 12 having the designed form and size. Therefore, the above formation of Au film 9 or Ti film 9 can protect particularly effectively the surface of Al film 3.

In the above manufacturing method of the semiconductor element, electrode layer 17 may be made of at least one material selected from a group containing Pd (palladium), Pt (platinum), Rh (rhodium), Os (osmium), Ir (iridium), Ni (nickel) and Au (gold). These materials allow formation of the ohmic contact with GaN-containing semiconductor layer 2.

In the above manufacturing method of the semiconductor element, the gallium nitride-containing semiconductor layer (GaN-containing semiconductor layer 2) may be a semiconductor layer formed by epitaxial growth on a nonpolar or semipolar substrate. More specifically, a substrate having a (10-10) plane as a main surface may be used as the nonpolar substrate. Also, the semipolar substrate may be formed of a substrate made of a compound material as will be described later and having a crystalline structure of hexagonal crystal and having a main surface of which normal vector is inclined by a predetermined angle, e.g., of 58° or more with respect to a plane direction [0001]. The use of this substrate can provide a nonpolar semiconductor layer or a semipolar semiconductor layer having a main surface of which normal vector is inclined by a predetermined angle with respect to the plane direction [0001] (i.e., has a large off angle to exhibit a semipolar property). When this GaN-containing semiconductor layer 2 is used, oxidation and the like of the top surface of ridge portion 12 forming electrode 7 may become particularly remarkable, and may cause a problem of deterioration of characteristics of the semiconductor element. Therefore, the present invention is particularly effective. The main surface of the substrate is a plane of the largest area on the substrate.

In the above manufacturing method of the semiconductor element, the semipolar substrate may be made of a material having a crystalline structure of hexagonal crystal, and the plane direction [0001] may be inclined by an angle from 63° to 80° or from 100° to 117° with respect to the normal vector of the main surface of the semipolar substrate. The main surface of GaN-containing semiconductor layer 2 formed in the above case is configured such that the plane direction [0001] is inclined by a predetermined angle with respect to the normal vector thereof (and, e.g., by an off-angle from 63° to 80° or from 100#d3g# to 117° when the crystal orientation of the semipolar substrate is also kept in GaN-containing semiconductor layer 2 as it is). The inventors have found that, in the above case, the problem of oxidation and contamination with impurities on the surface of GaN-containing semiconductor layer 2 becomes more remarkable than the GaN-containing semiconductor layer of which plane direction [0001] is hardly inclined with respect to the normal vector of the main surface. For example, according to the experiments by the inventors, the surface of the GaN layer exhibiting such a semipolar property that the off angle is 60° or more exhibits the surface oxidation of which degree is about 1.5 times as large as that of the surface (so-called c-surface) of the GaN layer of which main surface has the off angle of substantially 0°. The degree of the surface oxidation was evaluated by measuring a quantity of existing oxygen on the surface by XPS (X-ray Photoelectron Spectroscopy) after performing general organic cleaning and acid treatment on the surface of the GaN layer. The surface oxidation is particularly remarkable on the GaN-containing semiconductor layer of which off-angle is in a range from 63° to 80° or from 100° to 117°.

The invention can be applied particularly to the manufacturing method of the semiconductor element that is provided at the gallium nitride-containing semiconductor layer with the ridge portion.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A manufacturing method of a semiconductor element comprising the steps of:
    preparing a gallium nitride-containing semiconductor layer forming the semiconductor element;
    forming an electrode layer on said gallium nitride-containing semiconductor layer;
    forming a first film on said electrode layer;
    forming a second film having a pattern and made of a material of which rate of etching with alkaline etchant is smaller than that of a material of said first film;
    forming a coating film on said first film after the step of forming said first film and before the step of forming said second film;
    forming a ridge portion in said gallium nitride-containing semiconductor layer in a region located under said second film by performing the etching to remove partially said first film, said electrode layer and said gallium nitride-containing semiconductor layer masked with said second film;
    retreating a position of an end surface of said first film with respect to a position of an end surface of said second film by removing the end of said first film located on said ridge portion by the etching using said alkaline etchant;
    forming, on the side surface of said ridge portion and the top surface of said second film, a protective film made of a material of which rate of etching with said alkaline etchant is smaller than that of the material forming said first film;
    removing said first film by the etching using said alkaline etchant, and thereby removing said second film and a portion of said protective film formed on the top surface of said second film; and
    partially removing said coating film to have substantially the same pattern as said second film, wherein said step of partially removing said protective film also removes said coating film located on said first film.

2. The manufacturing method of the semiconductor element according to claim 1, wherein the step of forming said second film uses a lift-off method.

3. The manufacturing method of the semiconductor element according to claim 1, wherein said first film is made of aluminum.

4. The manufacturing method of the semiconductor element according to claim 1, wherein said coating film is made of gold or titanium.

5. The manufacturing method of the semiconductor element according to claim 1, wherein said second film is made of at least one material selected from a group containing silicon dioxide, silicon oxide, silicon nitride, zirconium oxide, tantalum oxide, lanthanum oxide, ceric oxide and hafnium oxide.

6. The manufacturing method of the semiconductor element according to claim 1, wherein said protective film is made of at least one material selected from a group containing silicon dioxide, silicon oxide, silicon nitride, zirconium oxide, tantalum oxide, lanthanum oxide, ceric oxide and hafnium oxide.

7. The manufacturing method of the semiconductor element according to claim 1, wherein said electrode layer is made of at least one material selected from a group containing palladium, platinum, rhodium, osmium, iridium, nickel and gold.

8. The manufacturing method of the semiconductor element according to claim 1, wherein said gallium nitride-containing semiconductor layer is a semiconductor layer formed by epitaxial growth on a nonpolar or semipolar substrate.

9. The manufacturing method of the semiconductor element according to claim 8, wherein
    said semipolar substrate is made of a material having a crystalline structure of hexagonal crystal, and
    a plane direction [0001] is inclined by an angle from 63° to 80° or from 100° to 117° with respect to a normal vector of the main surface of said semipolar substrate.

10. A manufacturing method of a semiconductor element comprising the steps of:
    preparing a gallium nitride-containing semiconductor layer forming the semiconductor element;
    forming an electrode layer on said gallium nitride-containing semiconductor layer;
    forming a first film on said electrode layer;
    forming a second film having a pattern and made of a material of which rate of etching with mixed acid made of phosphoric acid, nitric acid, acetic acid and water is smaller than that of a material of said first film;
    forming a coating film on said first film after the step of forming said first film and before the step of forming said second film;
    forming a ridge portion in said gallium nitride-containing semiconductor layer in a region located under said second film by performing the etching to remove partially said first film, said electrode layer and said gallium nitride-containing semiconductor layer masked with said second film;
    retreating a position of an end surface of said first film with respect to a position of an end surface of said second film by removing the end of said first film located on said ridge portion by the etching using said mixed acid;
    forming, on the side surface of said ridge portion and the top surface of said second film, a protective film made of a material of which rate of etching with said mixed acid is smaller than that of the material forming said first film;

removing said first film by the etching using said mixed acid, and thereby removing said second film and a portion of said protective film formed on the top surface of said second film; and partially removing said coating film to have substantially the same pattern as said second film, wherein said step of partially removing said protective film also removes said coating film located on said first film.

11. The manufacturing method of the semiconductor element according to claim 10, wherein the step of forming said second film uses a lift-off method.

12. The manufacturing method of the semiconductor element according to claim 10, wherein said first film is made of aluminum.

13. The manufacturing method of the semiconductor element according to claim 10, wherein said coating film is made of gold or titanium.

14. The manufacturing method of the semiconductor element according to claim 10, wherein said second film is made of at least one material selected from a group containing silicon dioxide, silicon oxide, silicon nitride, zirconium oxide, tantalum oxide, lanthanum oxide, ceric oxide and hafnium oxide.

15. The manufacturing method of the semiconductor element according to claim 10, wherein said protective film is made of at least one material selected from a group containing silicon dioxide, silicon oxide, silicon nitride, zirconium oxide, tantalum oxide, lanthanum oxide, ceric oxide and hafnium oxide.

16. The manufacturing method of the semiconductor element according to claim 10, wherein said electrode layer is made of at least one material selected from a group containing palladium, platinum, rhodium, osmium, iridium, nickel and gold.

17. The manufacturing method of the semiconductor element according to claim 10, wherein said gallium nitride-containing semiconductor layer is a semiconductor layer formed by epitaxial growth on a nonpolar or semipolar substrate.

18. The manufacturing method of the semiconductor element according to claim 17, wherein said semipolar substrate is made of a material having a crystalline structure of hexagonal crystal, and a plane direction [0001] is inclined by an angle from 63° to 80° or from 100° to 117° with respect to a normal vector of the main surface of said semipolar substrate.

\* \* \* \* \*